United States Patent
Shin et al.

(10) Patent No.: US 11,711,952 B2
(45) Date of Patent: Jul. 25, 2023

(54) DISPLAY DEVICE WITH POWER LINE IN DAM AND BRIDGE PATTERN UNDER DAM

(71) Applicant: Samsung Display Co., Ltd., Yongin-Si (KR)

(72) Inventors: Hwangsup Shin, Seongnam-si (KR); Eungtaek Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 330 days.

(21) Appl. No.: 17/096,506

(22) Filed: Nov. 12, 2020

(65) Prior Publication Data

US 2021/0257437 A1    Aug. 19, 2021

(30) Foreign Application Priority Data

Feb. 18, 2020 (KR) .......................... 10-2020-0019643

(51) Int. Cl.
*H10K 59/131* (2023.01)
*H10K 50/844* (2023.01)

(52) U.S. Cl.
CPC ......... *H10K 59/131* (2023.02); *H10K 50/844* (2023.02)

(58) Field of Classification Search
CPC ............ H01L 27/3276; H01L 51/5253; H10K 59/131; H10K 50/84
See application file for complete search history.

(56) References Cited

U.S. PATENT DOCUMENTS

| 10,170,534 B1* | 1/2019 | Kim ................... H01L 27/3223 |
| 2018/0097034 A1* | 4/2018 | Lee ..................... H01L 51/5253 |
| 2018/0226612 A1* | 8/2018 | Choi ................... H01L 27/3276 |
| 2018/0287093 A1 | 10/2018 | Lee et al. |
| 2019/0148469 A1* | 5/2019 | Lhee .................. H01L 27/3279 257/40 |
| 2020/0067017 A1* | 2/2020 | Seo .................... H01L 51/5256 |
| 2020/0185647 A1* | 6/2020 | Lee .................... H01L 27/3246 |
| 2020/0203653 A1* | 6/2020 | Um ..................... H01L 27/3276 |
| 2020/0212115 A1* | 7/2020 | Choi ................... H01L 51/5281 |
| 2020/0212356 A1* | 7/2020 | Kim ........................ G09G 3/006 |
| 2020/0235333 A1* | 7/2020 | Sung .................. H01L 51/5253 |
| 2020/0335722 A1* | 10/2020 | Kim .................... H01L 51/5246 |

FOREIGN PATENT DOCUMENTS

| KR | 10-2015-0024471 | 3/2015 |
| KR | 10-2018-0112171 | 10/2018 |
| KR | 10-2019-0023866 | 3/2019 |

* cited by examiner

*Primary Examiner* — Lex H Malsawma
(74) *Attorney, Agent, or Firm* — F. Chau & Associates, LLC

(57) ABSTRACT

A display device includes a substrate including a display area and a non-display area around the display area. A pixel is disposed on the display area. A first dam is disposed on the non-display area. The first dam includes a first sub-dam and a second sub-dam disposed on the first sub-dam. A first power line is disposed on the non-display area and passes between the first sub-dam and the second sub-dam. The first power line is connected to the pixel. A bridge pattern is disposed under the first sub-dam. The bridge pattern is connected to the first power line.

20 Claims, 13 Drawing Sheets

DISPLAY DEVICE WITH POWER LINE IN DAM AND BRIDGE PATTERN UNDER DAM

CROSS-REFERENCE TO RELATED APPLICATIONS

This application claims priority under 35 U.S.C. § 119 to Korean Patent Application No. 10-2020-0019643, filed on Feb. 18, 2020 in the Korean Intellectual Property Office, the disclosure of which is incorporated by reference in its entirety herein.

1. TECHNICAL FIELD

The present inventive concepts relate to a display device.

2. DISCUSSION OF RELATED ART

Numerous electronic devices include display devices for displaying images to a user, such as smart phones, digital cameras, notebook computers, navigation devices, and smart televisions. A display device generates an image and provides the generated image to the user through a display screen.

The display device may include a display panel including a plurality of pixels for generating an image, a driver for driving the pixels, and a power supply line that provides voltage to the pixels. The plurality of pixels are driven by supplying a driving voltage to the pixels through a power supply line and controlled by a driver.

SUMMARY

The present inventive concepts provide a display device that reduces the occurrence of power failures.

According to an exemplary embodiment of the present inventive concepts, a display device includes a substrate including a display area and a non-display area around the display area. A pixel is disposed on the display area. A first dam is disposed on the non-display area. The first dam includes a first sub-dam and a second sub-dam disposed on the first sub-dam. A first power line is disposed on the non-display area and passes between the first sub-dam and the second sub-dam. The first power line is connected to the pixel. A bridge pattern is disposed under the first sub-dam. The bridge pattern is connected to the first power line.

According to an exemplary embodiment of the present inventive concepts, a substrate includes a display area and a non-display area around the display area. A pixel is disposed on the display area. A first dam is disposed on the non-display area. A second dam is disposed between the first dam and the display area. A first power line is disposed on the non-display area and passes under a lower surface of the second dam and between an upper surface and a lower surface of the first dam. The first power line is connected to the pixel. A bridge pattern is disposed under the lower surface of the first dam and includes an exposed portion that extends to an outside of the first dam. The bridge pattern is connected to the first power line.

According to an exemplary embodiment of the present inventive concepts, a display device includes a substrate including a display area and a non-display area around the display area. A pixel is disposed on the display area. A first dam is disposed on the non-display area and includes an upper surface and lower surface. A first power line is disposed on the non-display area and passes between the upper surface and the lower surface of the first dam. The first power line is connected to the pixel. A bridge pattern is disposed under the lower surface of the first dam and connected to the first power line.

BRIEF DESCRIPTION OF THE DRAWINGS

The accompanying drawings are included to provide a further understanding of exemplary embodiments of the present inventive concepts, and are incorporated in and constitute a part of this specification. The drawings illustrate exemplary embodiments of the present inventive concepts and, together with the description, serve to explain principles of the present inventive concepts. In the drawings.

DETAILED DESCRIPTION OF EXEMPLARY EMBODIMENTS

Figure 1:
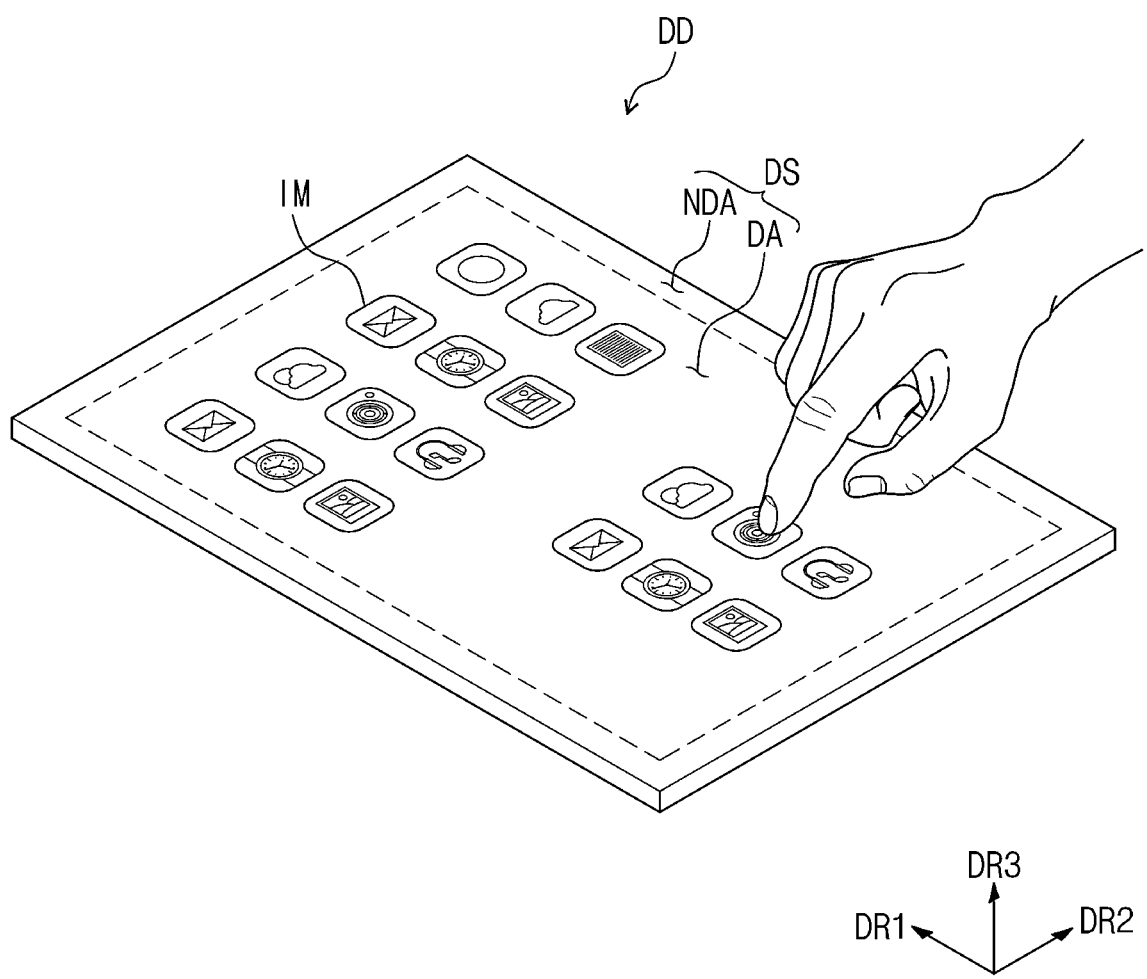
FIG. 1 is a perspective view of a display device according to an exemplary embodiment of the present inventive concepts.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the present inventive concepts. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing and the elements should not be limited by these relative terms.

Unless otherwise defined, all terms (including technical and scientific terms) used herein have the same meaning as terms commonly understood by those skilled in the art to which the present inventive concepts belong. In general, the terms defined in the dictionary should be considered to have the same meaning as the contextual meaning of the related art, and, unless clearly defined herein, should not be understood abnormally or as having an excessively formal meaning.

In various exemplary embodiments of the present inventive concepts, the term "include," "comprise," "including," or "comprising," specifies a property, a region, a fixed number, a step, a process, an element and/or a component but does not exclude other properties, regions, fixed numbers, steps, processes, elements and/or components.

Hereinafter, exemplary embodiments of the present inventive concepts are described in more detail with reference to the accompanying drawings.

FIG. 1 is a perspective view of a display device according to an exemplary embodiment of the present inventive concepts.

Referring to FIG. 1, a display device DD according to an exemplary embodiment of the present inventive concepts may have a rectangular shape with relatively longer sides extending in the first direction DR1 and relatively shorter sides extending in the second direction DR2 intersecting the first direction DR1. However, exemplary embodiments of the present inventive concepts are not limited thereto, and the display device DD may have various shapes such as a circle, a polygon, an irregular shape, etc. While the exemplary embodiment of FIG. 1 shows the first direction DR1 and the second direction DR2 as being perpendicular to each other, the first direction DR1 and the second direction DR2 may intersect each other in various different angles.

Hereinafter, the direction substantially perpendicular to the plane defined by the first direction DR1 and the second direction DR2 is defined as the third direction DR3 which is parallel to a thickness direction of the display device DD. In addition, in the present specification, the meaning when viewed on a plane may refer to a state viewed from the third direction DR3.

The upper surface of the display device DD may be defined as the display surface DS and may have a plane defined by the first direction DR1 and the second direction DR2. The images IM generated by the display device DD may be provided to the user through the display surface DS. While the exemplary embodiment shown in FIG. 1 shows images IM corresponding to icons of various different software applications, the display device DD may display one or more moving and still images of various different subject matter in other exemplary embodiments.

The display surface DS may include a display area DA and a non-display area NDA around the display area DA. The display area DA may display an image, and the non-display area NDA may not display an image. The non-display area NDA may surround the display area DA and may define the edge of the display device DD printed in a predetermined color. However, exemplary embodiments of the present inventive concepts are not limited thereto. For example, in some exemplary embodiments, the display area DA may extend to at least one edge of the display device DD and the non-display area NDA may not surround at least one side of the display area DA.

The display device DD may be used for large electronic devices such as televisions, monitors, external billboards, etc. In addition, the display device DD may be used in small and medium-sized electronic devices such as personal computers, notebook computers, personal digital terminals, car navigation systems, game machines, smartphones, tablets, cameras, etc. However, these electronic devices are presented as exemplary embodiments only and the display device DD may be used for other electronic devices in other exemplary embodiments of the present inventive concepts.

Figure 2:
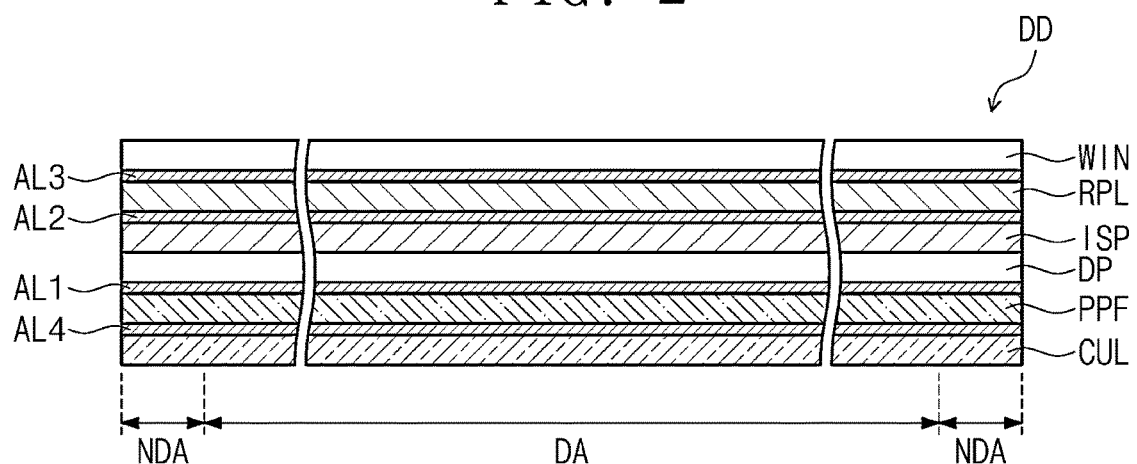
FIG. 2 is a cross-section view of the display device shown in FIG. 1 according to an exemplary embodiment of the present inventive concepts.

FIG. 2 is a diagram illustratively showing a cross-section of the display device shown in FIG. 1 according to an exemplary embodiment of the present inventive concepts.

Referring to the exemplary embodiment of FIG. 2, a display device DD may include a display panel DP, an input detection part ISP, an anti-reflection layer RPL, a window WIN, a panel protection film PPF, a cushion layer CUL, and first to fourth adhesive layers AL1 to AL4.

The display panel DP, the input detection part ISP, the anti-reflection layer RPL, and the window WIN may be disposed on a front surface of the display panel DP and may be positioned above the display panel DP. The panel protection film PPF and the cushion layer CUL may be disposed on a rear surface of the display panel DP and may be positioned below the display panel DP.

In an exemplary embodiment, the display panel DP may be a flexible display panel. For example, the display panel DP may include a plurality of electronic elements disposed on a flexible substrate. The display panel DP may include a display area DA and a non-display area NDA around the display area DA, like the display device DD.

The display panel DP according to an exemplary embodiment of the present inventive concepts may be a light emitting display panel. However, exemplary embodiments of the present inventive concepts are not limited thereto. For example, the display panel DP may be an organic light emitting display panel or a quantum dot light emitting display panel. In the organic light emitting display panel, the light emitting layer may include an organic light emitting material. The light emitting layer of the quantum dot light emitting display panel may include quantum dot, quantum rod, and the like. Hereinafter, the display panel DP is described as the organic light emitting display panel for convenience of explanation.

The input detection part ISP may be disposed on the display panel DP. The input detection part ISP may include a plurality of sensor parts for detecting an external input. For example, in an exemplary embodiment, the sensor parts may sense an external input in a capacitive manner. In an exemplary embodiment, the input detection part ISP may be directly manufactured on the display panel DP when the display panel DP is manufactured. However, exemplary embodiments of the present inventive concepts are not limited thereto, and the input detection part ISP may be manufactured as a panel separated from the display panel DP and then, attached to the display panel DP by an adhesive.

The anti-reflection layer RPL may be disposed on the input detection part ISP. The anti-reflection layer RPL may be defined as an external light anti-reflection film. The anti-reflection layer RPL may reduce reflectance of external light incident from the display device DD toward the display panel DP. For example, the anti-reflection layer RPL may include a phase retarder and/or a polarizer. However, exemplary embodiments of the present inventive concepts are not limited thereto.

The window WIN may be disposed on the anti-reflection layer RPL. The window WIN may protect the display panel DP, the input detection part ISP, and the anti-reflection layer RPL from external scratches and impacts. The window WIN may have optically transparent properties.

The panel protection film PPF may be disposed on a rear side of the display panel and may be positioned under the display panel DP. The panel protection film PPF may be defined as a protective substrate. The panel protection film PPF may protect the lower part of the display panel DP. The panel protection film PPF may include a flexible plastic material. For example, the panel protection film PPF may include polyethylene terephthalate (PET).

The cushion layer CUL may be disposed under the panel protection film PPF. The cushion layer CUL may protect the display panel DP by absorbing external impact applied to the lower part of the display device DD. The cushion layer CUL may include a foam sheet having a predetermined elastic force. However, exemplary embodiments of the present inventive concepts are not limited thereto and the cushion layer CUL may have various different configurations and be composed of various different materials.

As shown in the exemplary embodiment of FIG. 2, the first adhesive layer AL1 may be disposed between the display panel DP and the panel protection film PPF (e.g., in a thickness direction of the display device DD). The display panel DP and the panel protection film PPF may be bonded to each other by the first adhesive layer AL1.

The second adhesive layer AL2 may be disposed between the anti-reflection layer RPL and the input detection part ISP (e.g., in a thickness direction of the display device DD). The anti-reflection layer RPL and the input detection part ISP may be bonded to each other by the second adhesive layer AL2.

The third adhesive layer AL3 may be disposed between the window WIN and the anti-reflection layer RPL (e.g., in a thickness direction of the display device DD). The window WIN and the anti-reflection layer RPL may be bonded to each other by the third adhesive layer AL3.

The fourth adhesive layer AL4 may be disposed between the panel protection film PPF and the cushion layer CUL (e.g., in a thickness direction of the display device DD). The panel protection film PPF and the cushion layer CUL may be bonded to each other by the fourth adhesive layer AL4.

Figure 3:
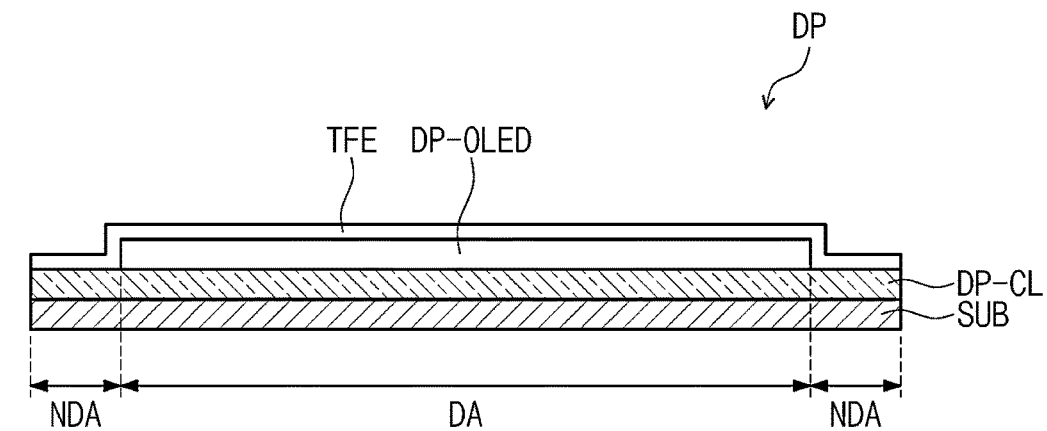
FIG. 3 is a cross-sectional view of a display panel shown in FIG. 2 according to an exemplary embodiment of the present inventive concepts.
Figure 3:
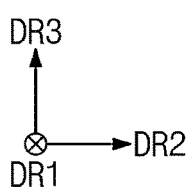

FIG. 3 is a diagram illustrating a cross-section of the display panel shown in FIG. 2 according to an exemplary embodiment of the present inventive concepts.

Referring to the exemplary embodiment of FIG. 3, a display panel DP may include a substrate SUB, a circuit element layer DP-CL disposed on the substrate SUB, a display element layer DP-OLED disposed on the circuit element layer DP-CL, and a thin film sealing layer TFE disposed on the display element layer DP-OLED.

The substrate SUB may include a display area DA and a non-display area NDA around the display area DA. For example, the non-display area NDA may surround the display area DA (e.g., in the first and second directions DR1, DR2). In an exemplary embodiment, the substrate SUB may include a flexible plastic material. For example, the substrate SUB may include polyimide (PI). However, exemplary embodiments of the present inventive concepts are not limited thereto.

The display element layer DP-OLED may be disposed on the display area DA. The thin film sealing layer TFE may be disposed on the circuit element layer DP-CL to cover the display element layer DP-OLED. For example, as shown in the exemplary embodiment of FIG. 3, the thin film sealing layer TFE may directly contact an upper surface and lateral edges (e.g., lateral ends) of the display element layer DP-OLED.

A plurality of pixels may be disposed on the circuit element layer DP-CL and the display element layer DP-OLED. Each of the pixels may include at least one transistor disposed on the circuit element layer DP-CL and a light emitting element disposed on the display element layer DP-OLED and connected to the transistor. The configuration of the pixel will be described in detail below.

Figure 4:
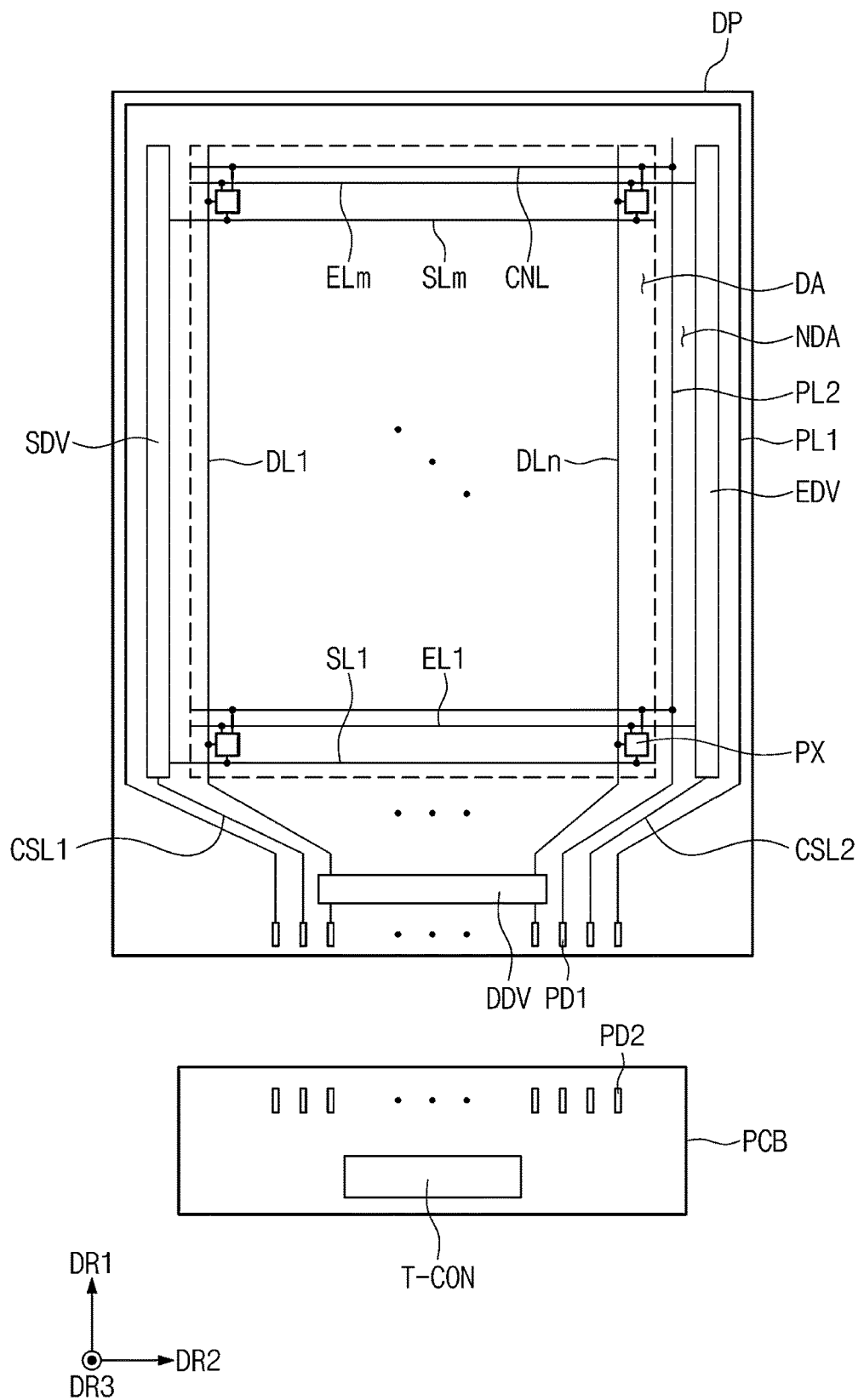
FIG. 4 is a plan view of a display panel shown in FIG. 3 according to an exemplary embodiment of the present inventive concepts.

FIG. 4 is a plan view of the display panel shown in FIG. 3 according to an exemplary embodiment of the present inventive concepts.

Referring to the exemplary embodiment of FIG. 4, the display device DD may include a display panel DP, a scan driver SDV, a data driver DDV, an emission driver EDV, a printed circuit board PCB, and a timing controller T-CON.

As shown in the exemplary embodiment of FIG. 4, the display panel DP may have a rectangular shape having relatively longer sides extending in the first direction DR1 and short sides extending in the second direction DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, connection lines CNL, and a plurality of pads PD1 and PD2. m and n are natural numbers. The above-described lines may be disposed on the circuit element layer DP-CL shown in the exemplary embodiment of FIG. 3.

As shown in the exemplary embodiment of FIG. 4, the pixels PX may be disposed in the display area DA. The scan driver SDV, the data driver DDV, and the emission driver EDV may be disposed in the non-display area NDA. The scan driver SDV and the emission driver EDV may be disposed in the non-display areas NDA adjacent to the relatively longer sides of the display panel DP, respectively. For example, as shown in the exemplary embodiment of FIG. 4, the scan driver SDV may be disposed on the left side (e.g., in the second direction DR2) of the non-display area NDA, the emission driver EDV may be disposed on the right side (e.g., in the second direction DR2) of the non-display area NDA and the data driver DDV may be disposed on the lower side (e.g., in the first direction DR1) of the non-display area NDA.

In an exemplary embodiment, the data driver DDV may be fabricated in the form of an integrated circuit chip and mounted on the display panel DP. The data driver DDV may be disposed in the non-display area NDA adjacent to one of the relatively shorter sides of the display panel DP. However, exemplary embodiments of the present inventive concepts are not limited thereto. For example, in other exemplary embodiments, the data driver DDV may be mounted on the flexible circuit board connected to the display panel DP, and may be connected to the display panel DP through the flexible circuit board. For example, when viewed on a plane (e.g., in a plane defined by the first and second directions DR1. DR2), the data driver DDV may be adjacent to the lower end of the display panel DP.

The scan lines SL1 to SLm are arranged in the first direction DR1 and may extend in the second direction DR2 to be connected to the pixels PX and the scan driver SDV.

The data lines DL1 to DLn are arranged in the second direction DR2 and may extend in the first direction DR1 to be connected to the pixels PX and the data driver DDV. The emission lines EL1 to ELm are arranged in the first direction DR1 and may extend in the second direction DR2 and may be connected to the pixels PX and the emission driver EDV. However, exemplary embodiments of the present inventive concepts are not limited thereto.

The first power line PIA may be disposed in a non-display area NDA. The first power line PL1 may extend along the edge of the display panel DP. The first power line PL1 may be adjacent to relatively long sides of the display panel DP. In addition, the first power line PL1 may be adjacent to the other relatively shorter side of the display panel DP in which the data driver DDV is not disposed. For example, as shown in the exemplary embodiment of FIG. 4, the first power line PL1 may extend from a lower side (e.g., in the first direction DR1) of the display panel DP and may be disposed on an edge of the left and right sides (e.g., in the second direction DR2) and the upper side (e.g., in the first direction DR1) of the display panel DP. The first power line PL1 may be disposed more outside than the scan driver SDV and emission driver EDV.

The first power line PL1 may receive a first voltage. The first power line PL1 may extend to the display area DA and may be connected to the pixels PX, and the first voltage may be provided to the pixels PX through the first power line PLL.

The second power line PL2 may extend in the first direction DR1 and may be disposed in the non-display area NDA. For example, as shown in the exemplary embodiment of FIG. 4, the second power line PL2 may be disposed on a right side (e.g., in the second direction DR2) of the display panel DP and may be disposed between the display area DA and the emission driver EDV (e.g., in the second direction DR2). However, exemplary embodiments of the present inventive concepts are not limited thereto. For example, in another exemplary embodiment, the second power line PL2 may be disposed on the right side (e.g., in the second direction DR2) of the display panel DP between the display area DA and the scanning driver SDV (e.g., in the second direction DR2). The second power line PL2 may receive a second voltage having a higher power level than the first voltage.

The connection lines CNL may extend in the second direction DR2 and may be arranged in the first direction DR1. The connection lines CNL may be connected to the second power line PL2 and the pixels PX. The second voltage may be applied to the pixels PX through the second power line PL2 and the connection lines CNL connected to each other.

The first control line CSL1 is connected to the scan driver SDV and, when viewed on a plane (e.g., a plane defined in the first direction DR1 and the second direction DR2), may extend toward the lower end of the display panel DP. The second control line CSL2 is connected to the emission driver EDV, and when viewed on a plane (e.g., a plane defined in the first direction DR1 and the second direction DR2), may extend toward the lower end of the display panel DP. The data driver DDV may be disposed between the first control line CSL1 and the second control line CSL2 (e.g., in the second direction DR2).

The pads may include a plurality of first pads PD1 disposed on the display panel DP and a plurality of second pads PD2 disposed on the printed circuit board PCB. The data driver DDV, the first power line PL1, the second power line PL2, the first control line CSL1, and the second control line CSI2 may be connected to the first pads PD1. As shown in the exemplary embodiment of FIG. 4, the first pads PD1 may be disposed on a lower side (e.g., in the first direction DR1) of the non-display area NDA.

The data lines DL1 to DLn may be connected to corresponding first pads PD1 among the first pads PD1 through the data driver DDV. For example, the data lines DL1 to DLn may be connected to the data driver DDV, and the data driver DDV may be connected to the first pads PD1 respectively corresponding to the data lines DL1 to DLn.

The timing controller T-CON may be disposed on the printed circuit board PCB. In an exemplary embodiment, the timing controller T-CON may be fabricated with an integrated circuit chip and mounted on the printed circuit board PCB.

The second pads PD2 may be disposed on a side of the printed circuit board PCB adjacent to the display panel DP. For example, as shown in the exemplary embodiment of FIG. 4, the second pads PD2 may be disposed on an upper side (e.g., in the first direction DR1) of the printed circuit board PCB and may be disposed adjacent to the display panel DP in the first direction DR1. The second pads PD2 may be connected to the first pads PD1. The flexible circuit board may be connected to the first pads PD1 and the second pads PD2 to connect the printed circuit board PCB and the display panel DP.

The timing controller T-CON may be connected to corresponding second pads PD2 among the second pads PD2. The timing controller T-CON may be connected to the first pads PD1 connected to the data driver DDV and the first and second control lines CSL1 and CSL2 through the corresponding second pads PD2.

The voltage generator may be disposed on the printed circuit board PCB, and may be connected to corresponding second pads PD2 among the second pads PD2. The voltage generator may be connected to the first pads PD1 connected to the first and second power lines PL1 and PL2 through the corresponding second pads PD2.

The timing controller T-CON may control operations of the scan driver SDV, the data driver DDV, and the emission driver EDV. For example, the timing controller T-CON may generate a scan control signal, a data control signal, and an emission control signal in response to control signals received from the outside. However, exemplary embodiments of the present inventive concepts are not limited thereto.

The scan control signal may be provided to the scan driver SDV through the first control line CSL1. The emission control signal may be provided to the emission driver EDV through the second control line CSL2. The data control signal may be provided to the data driver DDV. The timing controller T-CON may receive the image signals from the outside, convert the data format of the image signals to match the interface specification with the data driver DDV, and provide the converted image data to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines ELl to ELm.

The pixels PX may be provided with the data voltages in response to the scan signals. The pixels PX may display an image by emitting light having luminance corresponding to data voltages in response to emission signals. The emission time of the pixels PX may be controlled by emission signals.

Figure 5:
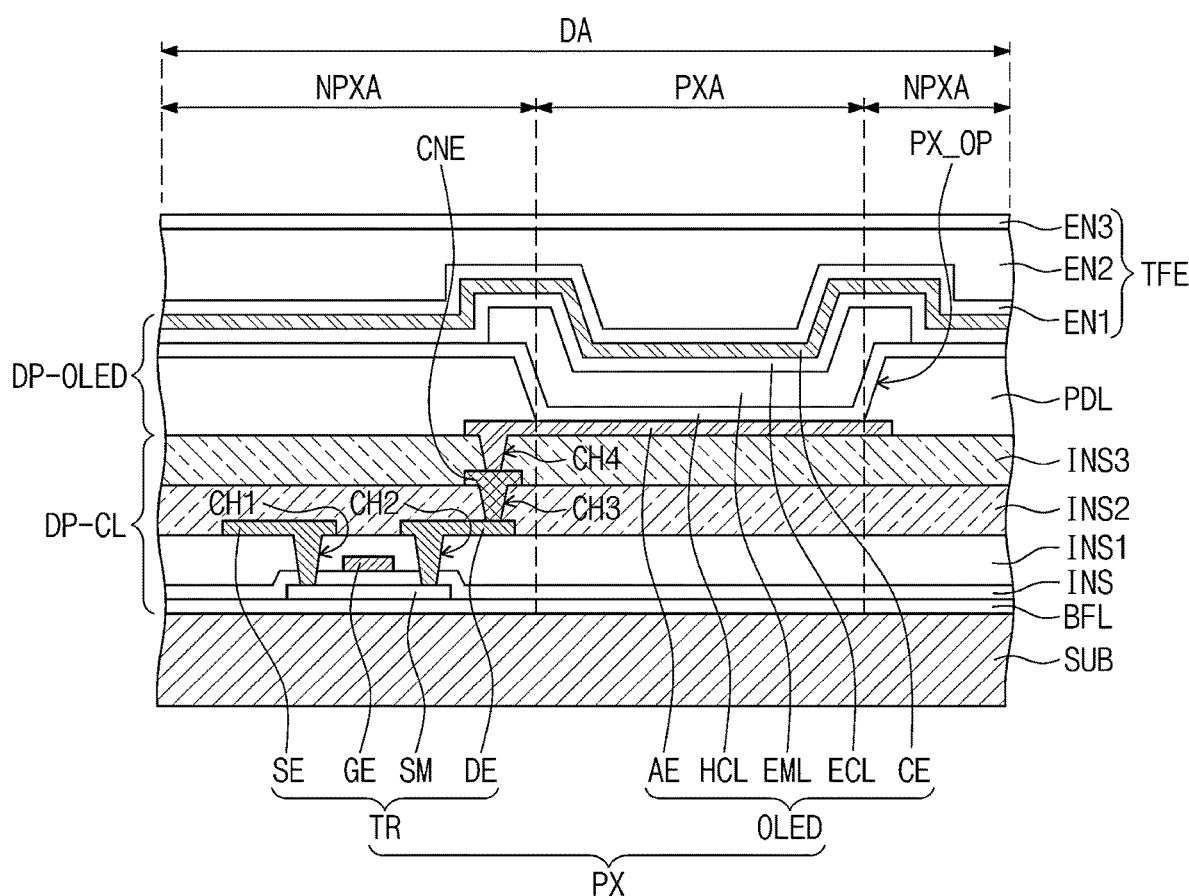
FIG. 5 is a cross-sectional view showing a configuration of one pixel shown in FIG. 4 according to an exemplary embodiment of the present inventive concepts.

FIG. 5 is a diagram exemplarily showing a cross-sectional configuration of one pixel shown in FIG. 4 according to an exemplary embodiment of the present inventive concepts.

Referring to the exemplary embodiment of FIG. 5, the pixel PX may include a light emitting element OLED and a transistor TR connected to the light emitting element OLED. The light emitting element OLED may include a first electrode AE, a second electrode CE, a hole control layer HCL, an electron control layer ECL, and a light emitting layer EML. In an exemplary embodiment, the first electrode AE may be an anode electrode, and the second electrode CE may be a cathode electrode. The light emitting element OLED may be defined as an organic light emitting element.

The display area DA may include a light emitting area PXA corresponding to each of the pixels PX and a non-light emitting area NPXA around the light emitting area PXA. The light emitting element OLED may be disposed in the light emitting area PXA, and the transistor TR may be disposed in the non-light emitting area NPXA.

The transistor TR and the light emitting element OLED may be disposed on the substrate SUB. The buffer layer BFL is disposed on the substrate SUB. For example, the buffer layer BFL may be disposed directly on the substrate SUB. In an exemplary embodiment, the buffer layer BFL may include an inorganic material.

The semiconductor layer SM of the transistor TR may be disposed on the buffer layer BFL. In an exemplary embodiment, the semiconductor layer SM may include a semiconductor of an inorganic material such as amorphous silicon or poly silicon, or an organic semiconductor. Additionally, the semiconductor layer SM may include an oxide semiconductor. However exemplary embodiments of the present inventive concepts are not limited thereto. The semiconductor layer SM may include a source area, a drain area, and a channel area disposed between the source area and the drain area.

The insulating layer INS may be disposed on the buffer layer BFL and may cover the semiconductor layer SM. In an exemplary embodiment, the insulating layer INS may include an inorganic material. The gate electrode GE of the transistor TR overlapping the semiconductor layer SM may be disposed on the insulating layer INS. The gate electrode GE may be disposed to overlap (e.g., in a thickness direction of the substrate SUB) the channel area of the semiconductor layer SM.

The first insulating layer INS1 may be disposed on the insulating layer INS to cover the gate electrode GE. For example, as shown in the exemplary embodiment of FIG. 5, the first insulating layer INS1 may cover an upper surface and lateral side surfaces of the gate electrode GE. The first insulating layer INS1 may include an organic material and/or an inorganic material.

A source electrode SE and a drain electrode DE of the transistor TR may be spaced from each other and disposed on the first insulating layer INS1. The source electrode SE may be connected to the source area of the semiconductor layer SM through a first contact hole CH1 that is defined in the insulating layer INS and the first insulating layer INS1. The drain electrode DE may be connected to the drain area of the semiconductor layer SM through the second contact hole CH2 defined in the insulating layer INS and the first insulating layer INS1.

The source electrode SE may be connected to the second power line PL2 through the connection line CNL shown in the exemplary embodiment of FIG. 4. The source electrode SE may receive the second voltage through the second power line PL2 and the connection line CNL.

A second insulating layer INS2 may be disposed on the first insulating layer INS1 to cover the source electrode SE and the drain electrode DE of the transistor TR. For example, as shown in the exemplary embodiment of FIG. 5, the second insulating layer INS2 may directly contact an upper surface and lateral side surfaces of the source electrode SE and the drain electrode DE. In an exemplary embodiment, the second insulating layer INS2 may include an organic material. A connection electrode CNE may be disposed on the second insulating layer INS2. The connection electrode CNE may be connected to the drain electrode DE through the third contact hole CH3 defined in the second insulating layer INS2.

A third insulating layer INS3 may be disposed on the second insulating layer INS2 to cover the connection electrode CNE. For example, as shown in the exemplary embodiment of FIG. 5, the third insulating layer INS3 may directly contact an upper surface and lateral side surfaces of the connection electrode CNE. The first electrode AE may be disposed on the third insulating layer INS3. The first electrode AE may be connected to the connection electrode CNE through the fourth contact hole CH4 defined in the third insulating layer INS3.

The first electrode AE may be connected to the connection line CNL and the second power line PL2 shown in the exemplary embodiment of FIG. 4 through the connection electrode CNE and the transistor TR. The first electrode AE may receive the second voltage through the connection electrode CNE and the transistor TR.

A pixel defining film PDL exposing a predetermined portion of the first electrode AE may be disposed on the first electrode AE and the third insulating layer INS3. A pixel opening part PX_OP for exposing a predetermined portion of the first electrode AE may be defined in the pixel defining film PDL. For example, as shown in the exemplary embodiment of FIG. 5, the pixel opening part PX_OP may expose a central portion of the first electrode AE. However, exemplary embodiments of the present inventive concepts are not limited thereto.

The hole control layer HCL may be disposed on the first electrode AE and the pixel defining film PDL. In an exemplary embodiment, the hole control layer HCL may be commonly disposed in the light emitting area PXA and the non-light emitting area NPXA. The hole control layer HCL may include a hole transport layer and a hole injection layer.

The light emitting layer EML may be disposed on the hole control layer HCL. The light emitting layer EML may be disposed in an area corresponding to the opening part PX_OP. For example, the light emitting layer EML may be formed separately from each other in each of the pixels PX. The light emitting layer EML may include organic materials and/or inorganic materials. The light emitting layer EML may generate light of any one of red, green, and blue. However, exemplary embodiments of the present inventive concepts are not limited thereto and the light emitting layer EML of the pixels PX may generate various different colors, such as a white light by a combination of organic materials generating red, green, and blue.

The electron control layer ECL may be disposed on the light emitting layer EML. The electron control layer ECL may be disposed on the hole control layer HCL to cover the light emitting layer EML. For example, the electron control layer ECL may be commonly disposed in the light emitting area PXA and the non-light emitting area NPXA. In an exemplary embodiment, the electron control layer ECL may include an electron transport layer and may further include an electron injection layer.

The second electrode CE may be disposed on the electron control layer ECL. In an exemplary embodiment, the second electrode CE may be commonly disposed in the pixels PX. The second electrode CE may be connected to the first power line PL1 shown in the exemplary embodiment of FIG. 4. The second electrode CE may receive the first voltage through the first power line PLL.

The thin film sealing layer TFE may be disposed on the second electrode CE. The thin film sealing layer TFE may include a first sealing layer EN1 disposed on the second electrode CE, a second sealing layer EN2 disposed on the first sealing layer EN1, and a third sealing layer EN3 disposed on the second sealing layer EN2. The first and third sealing layers EN1 and EN3 may be inorganic insulating layers, and the second sealing layer EN2 may be an organic insulating layer. However, exemplary embodiments of the present inventive concepts are not limited thereto and the thin film sealing layer TFE may include various different numbers and arrangements of sealing layers which include at least one organic insulating layer and at least one inorganic insulating layer.

The first and third sealing layers EN1 and EN3 may protect the pixel PX from moisture and oxygen. The second sealing layer EN2 may include an organic material and may protect the pixel PX from foreign materials such as dust particles. The input detection part ISP may be disposed on the thin film sealing layer TFE.

The layers extending from the buffer layer BFL to the third insulating layer INS3 (e.g., in a thickness direction of the substrate SUB) may be defined as a circuit element layer DP-CL. The layers extending from the first electrode AE to the second electrode CE (e.g., in a thickness direction of the substrate SUB) may be defined as a display element layer DP-OLED.

The first voltage may be applied to the second electrode CE. The second voltage may be applied to the first electrode AE of the light emitting element OLED through the transistor TR. An exciton is formed as holes and electrons injected to the light emitting layer EML are combined and the light emitting element OLED may emit light as the excitons transition to the ground state. The light emitting element OLED may emit light, so that an image may be displayed.

Figure 6:
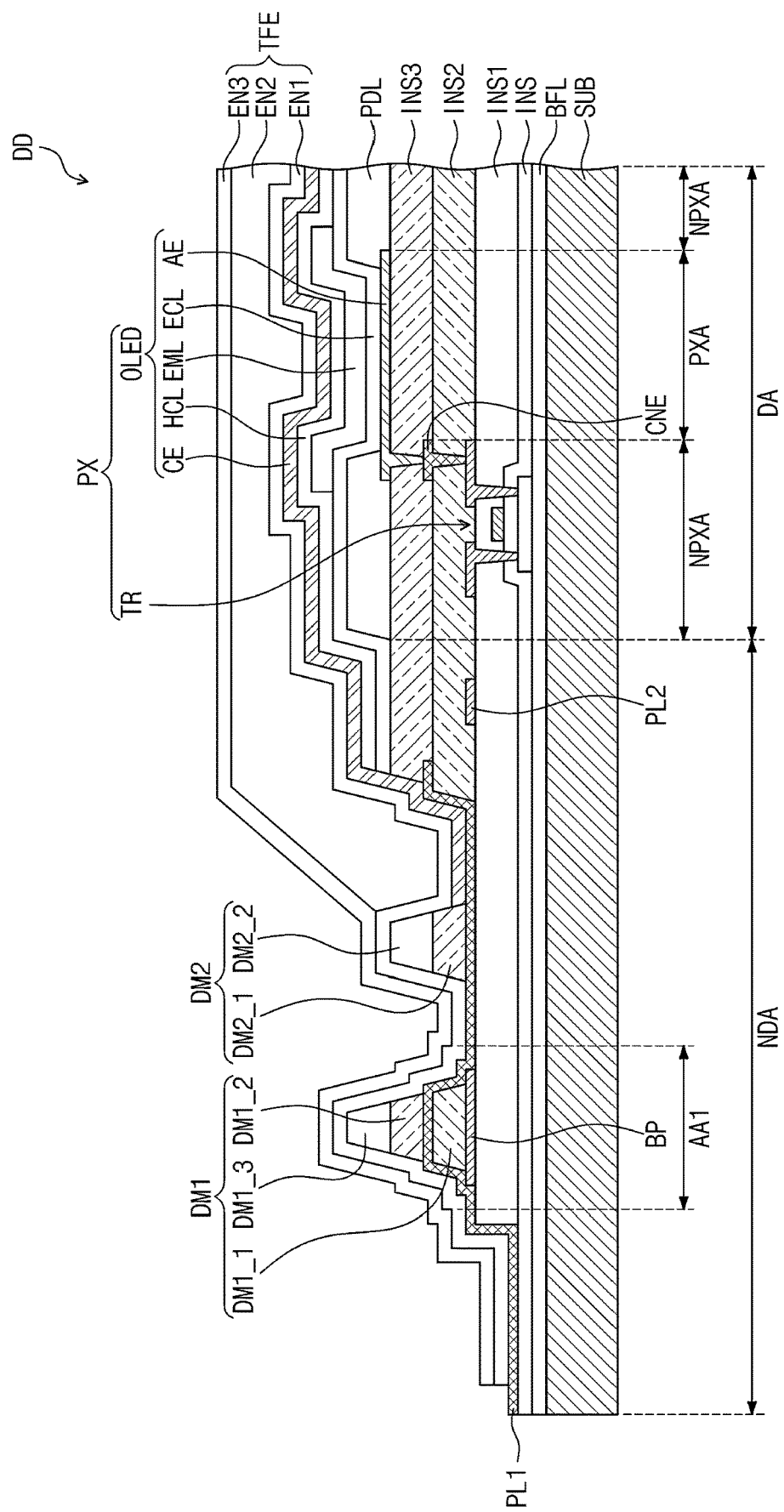
FIG. 6 is a cross-sectional view of the pixel shown in FIG. 5 from the first power line to a pixel connected to the first power line according to an exemplary embodiment of the present inventive concepts.
Figure 7:
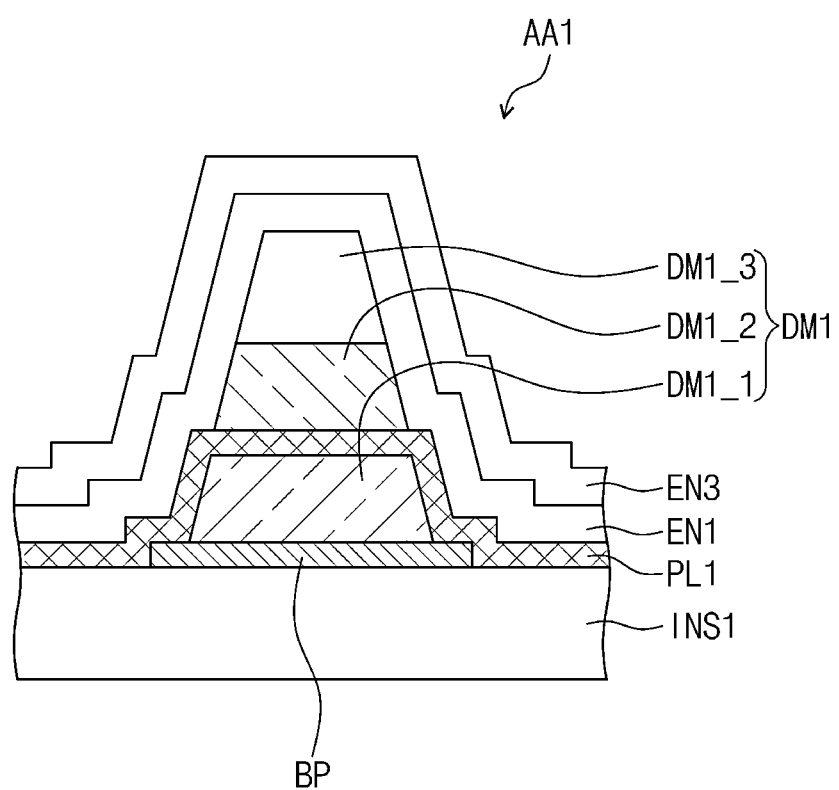
FIG. 7 is an enlarged view of the first area AA1 shown in FIG. 6.
Figure 8:
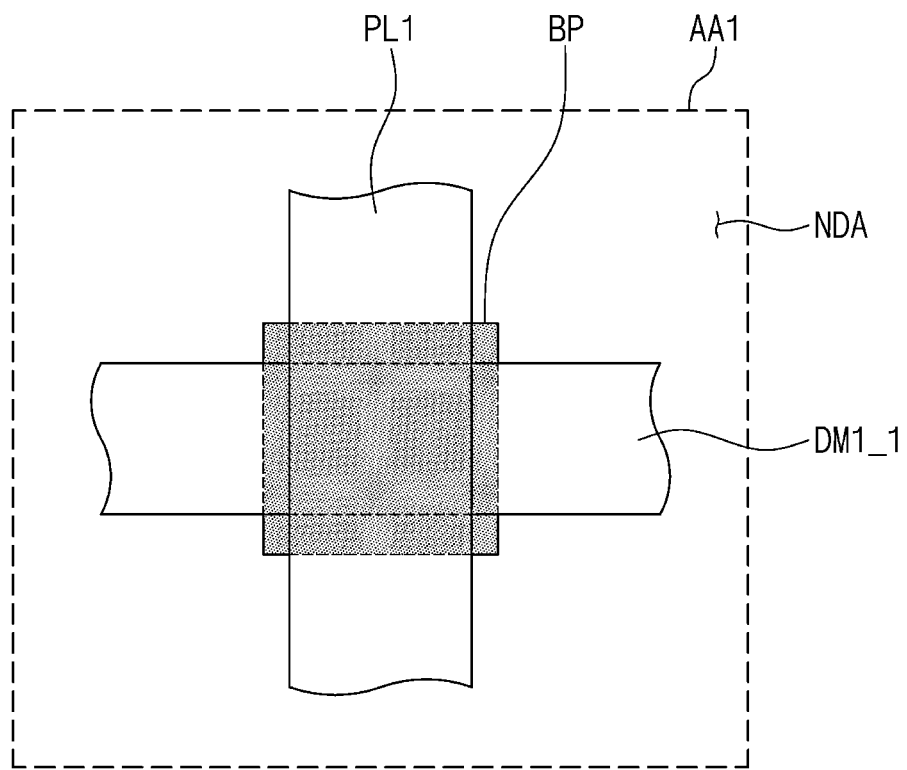
FIG. 8 is a plan view of the first area AA1 shown in FIG. 6 when viewed from a plane.

FIG. 6 is a diagram exemplarily showing a cross-sectional configuration from the first power line shown in FIG. 5 to a pixel connected to the first power line according to an exemplary embodiment of the present inventive concepts. FIG. 7 is an enlarged view of the first area AA1 shown in FIG. 6 according to an exemplary embodiment of the present inventive concepts. FIG. 8 is a plan view of the first area AA1 shown in FIG. 6 when viewed from a plane according to an exemplary embodiment of the present inventive concepts.

For example, in FIG. 7, components under the first insulating layer INS1 are omitted for convenience of illustration. In addition, in FIG. 8, illustratively, only a portion of the first power line PL1, a bridge pattern BP, and a portion of the first sub-dam DM1_1 are illustrated for convenience of illustration.

Referring to the exemplary embodiment of FIG. 6, the pixel PX may be disposed on the display area DA of the substrate SUB. The second power line PL2 may extend generally in the first direction DR1 and may be disposed in the non-display area NDA.

The second power line PL2 may be disposed on the first insulating layer INS1, and the second insulating layer INS2 may be disposed on the second power line PL2. For example, as shown in the exemplary embodiment of FIG. 6, a lower surface of the second power line PL2 may directly contact an upper surface of the first insulating layer INS1 and a lower surface of the second insulating layer INS2 may directly contact an upper surface and lateral side surfaces of the second power line PL2. In an exemplary embodiment, the second power line PL2 may be connected to the transistor TR through the connection line CNL shown in the exemplary embodiment of FIG. 4.

The buffer layer BFL, the insulating layer INS, and the first insulating layer INS1 may be disposed on the display area DA and may extend to the non-display area NDA. As shown in the exemplary embodiment of FIG. 6, the buffer layer BFL and the insulating layer INS may extend farther in the non-display area NDA from the display area DA than the first insulating layer INS1. However, exemplary embodiments of the present inventive concepts are not limited thereto.

The second insulating layer INS2 and the third insulating layer INS3 may be disposed on the display area DA and may extend to the non-display area NDA. For example, as shown in the exemplary embodiment of FIG. 6, the second insulating layer INS2 and the third insulating layer INS3 may extend to a portion of the non-display area NDA proximate to the boundary between the display area DA and the non-display area NDA. The first insulating layer INS1 may extend farther in the non-display area NDA from the display area DA than the second insulating layer INS2 and the third insulating layer INS3.

The pixel defining film PDL may be disposed on the display area DA. In an exemplary embodiment, the hole control layer HCL and the electron control layer ECL disposed on the display area DA may extend to the non-display area NDA and may be disposed on the third insulating layer INS3.

The display device DD may include a first dam DM1, a second dam DM2, and a bridge pattern BP on the non-display area NDA. The first dam DM1, the second dam DM2, and the bridge pattern BP may be disposed on the first insulating layer INS1 in the non-display area NDA. The first dam DM1, the second dam DM2, and the bridge pattern BP may be spaced apart from lateral edges of the second and third insulating layers INS2 and INS3. For example, the first dam DM1, the second dam DM2, and the bridge pattern BP may be positioned farther in the non-display area NDA from the display area DA than the lateral edges of the second and third insulating layers INS2 and INS3.

The second dam DM2 may be disposed between the display area DA and the first dam DM1. For example, the second dam DM2 may be disposed between the lateral edges (e.g., lateral ends) of the second and third insulating layers INS2 and INS3 in the non-display area NDA and the first dam DM1.

Referring to the exemplary embodiments of FIGS. 6 and 7, the bridge pattern BP may be disposed under the first dam DM1 (e.g., in a thickness direction of the substrate SUB).

For example, the bridge pattern BP may be disposed under a lower surface of the first dam DM1. As shown in the exemplary embodiments of FIGS. 6 and 7, the bridge pattern BP may be disposed between the first insulating layer INS1 and the first dam DM1 (e.g., in a thickness direction of the substrate SUB). For example, as shown in the exemplary embodiment of FIG. 6, a lower surface of the bridge pattern BP may directly contact an upper surface of the first insulating layer INS1 and an upper surface of the bridge pattern BP may directly contact a lower surface of the first dam DM1. The bridge pattern BP may include an exposed portion that extends more outwardly than the first dam DM1 (e.g., extending in a direction parallel to the upper surface of the substrate SUB). Therefore, as shown in the exemplary embodiment of FIG. 6, both lateral sides of the bridge pattern BP may include exposed portions that are exposed outside of the first dam DM1.

The bridge pattern BP may include a conductive material. In an exemplary embodiment, the bridge pattern BP may be formed by simultaneously patterning the same material as the source and drain electrodes of the second power line PL2 and the transistor TR.

The first power line PL1 may be disposed on the insulating layer INS which extends farther in the non-display area NDA from the display area DA than the first insulating layer INS1. For example, the first power line PL1 may directly contact the portion of the insulating layer INS in the non-display area NDA which is farther from the display area DA than the first insulating layer INS1. The first power line PL1 may extend from a position farther in the non-display area NDA than the first insulating layer INS1 to the first insulating layer INS1. For example, the first power line PL1 may directly contact a lateral edge (e.g., a lateral end) of the first insulating layer INS1 and an upper surface of the first insulating layer INS1. The first power line PL1 may extend toward the lateral edge (e.g., a lateral end) of the second insulating layer INS2 in the non-display area NDA.

The first power line PL1 may extend through the first dam DM1. For example, the first power line PL1 may pass between an upper surface and a lower surface of the first dam DM1. The first power line PL1 may be electrically connected to the bridge pattern BP by contacting the exposed portion of the bridge pattern BP that is exposed to the outside of the first dam DM1. For example, as shown in the exemplary embodiment of FIG. 6, the first power line PL1 may directly contact an upper surface and both lateral edges of the bridge pattern BP for connection to the first power line PLL.

The first power line PL1 may extend on the first insulating layer INS1 to be disposed under the second dam DM2 and may passing under the second dam DM2 to extend toward a lateral edge (e.g., a lateral end) of the second insulating layer INS2 in the non-display area NDA. The first power line PL1 may be disposed under (e.g., passes under) a bottom surface of the second dam DM2. For example, as shown in the exemplary embodiment of FIG. 6, a lower surface of the first power line PL1 may contact an upper surface of the first insulating layer INS1 and an upper surface of the first power line PL1 may contact a lower surface of the second dam DM2 to pass between the second dam DM2 and the first insulating layer INS1.

The first power line PL1 may extend on the first insulating layer INS1 to be disposed on the lateral edge (e.g., the lateral end in the non-display area NDA) of the second insulating layer INS2. For example, as shown in the exemplary embodiment of FIG. 6, the first power line PL1 may directly contact a lateral edge and an adjacent upper surface of the second insulating layer INS2. In an exemplary embodiment, the first power line PL1 may be formed by simultaneously patterning the same material as the connection electrode CNE.

The second electrode CE of the light emitting element OLED may extend to the non-display area NDA and may be disposed on the electron control layer ECL. For example, as shown in the exemplary embodiment of FIG. 6, the second electrode CE may directly contact aligned lateral edges of the electron control layer ECL, the hole control layer HCL and the third insulating layer INS3 in the non-display area NDA.

The second electrode CE may extend to the non-display area NDA, and may be disposed on the first power line PL1 between respective lateral edges of the second dam DM2 and the second insulating layer INS2. The second electrode CE may directly contact the first power line PL1 to be electrically connected to the first power line PL1. For example, as shown in the exemplary embodiment of FIG. 6, the second electrode CE may directly contact a portion of the first power line PL1 that also contacts a lateral edge and an adjacent upper surface of the second insulating layer INS2 and a portion of the first power line PL1 that also contacts the first insulating layer INS1 between the second insulating layer INS2 and the second dam DM2. As a result, the first power line PL1 may be electrically connected to the pixel PX.

The first sealing layer EN1 may extend to a non-display area NDA. The first sealing layer EN1 may be disposed on the second electrode CE, the first power line PL1, the first dam DM1, and the second dam DM2 in the non-display area NDA. For example, as shown in the exemplary embodiment of FIG. 6, a lower surface of the first sealing layer EN1 may directly contact upper surfaces of the second electrode CE, the first power line PL1, the first dam DM1, and the second dam DM2 in the non-display area NDA.

The second sealing layer EN2 may extend to the non-display area NDA. A lateral edge (e.g., a lateral end) of the second sealing layer EN2 in the non-display area NDA may be disposed on the second dam DM2. For example, as shown in the exemplary embodiment of FIG. 6 the lateral edge of the second sealing layer EN2 in the non-display area NDA may directly contact a lateral edge of the second dam DM2. The first sealing layer EN1 may extend farther in the non-display area NDA from the display area DA than the second sealing layer EN2.

In an exemplary embodiment, when manufacturing the display device DD, an organic material having fluidity may be cured to form the second sealing layer EN2. In instances in which the organic material having fluidity of the second sealing layer EN2 flows into the non-display area NDA, the second dam DM2 may block the organic material from flowing further. Additionally, organic material of the second sealing layer EN2 overflowing the second dam DM2 may be blocked by the first dam DM1.

The third sealing layer EN3 may extend from the display area DA to the non-display area NDA. As shown in the exemplary embodiment of FIG. 6, the third sealing layer EN3 may be disposed on the first sealing layer EN1 and the second sealing layer EN2 in the non-display area NDA.

As shown in the exemplary embodiment of FIG. 6, the first dam DM1 may include a first sub-dam DM1_1, a second sub-dam DM1_2 disposed on the first sub-dam DM11, and a third sub-dam DM1_3 disposed on the second sub-dam DM1_2 (e.g., in a thickness direction of the substrate SUB). In an exemplary embodiment, the first sub-dam DM1_1 may include the same material as the second insulating layer INS2. The second sub-dam DM1_2 may include the same material as the third insulating layer INS3. The third sub-dam DM1_3 may include the same material as the pixel defining film PDL. While the exemplary embodiment of FIG. 6 shows the first dam DM1 including three sub-dams, exemplary embodiments of the present inventive concepts are not limited thereto. For example, the first dam DM1 may include a plurality of sub-dams having various numbers of sub-dams in other exemplary embodiments.

As shown in the exemplary embodiment of FIG. 6, the second dam DM2 may include a fourth sub-dam DM2_1 and a fifth sub-dam DM2_2 disposed on the fourth sub-dam DM2_1 (e.g., in a thickness direction of the substrate SUB). In an exemplary embodiment, the fourth sub-dam DM2_1 may include the same material as the second sub-dam DM1_2. The fifth sub-dam DM2_2 may include the same material as the third sub-dam DM1_3. While the exemplary embodiment of FIG. 6 shows the second dam DM2 including two sub-dams, exemplary embodiments of the present inventive concepts are not limited thereto. For example, the second dam DM2 may include one or more sub-dams in various numbers in other exemplary embodiments.

In an exemplary embodiment, the first sub-dam DM1_1 and the second insulating layer INS2 may be formed by simultaneously patterning the same material. The second sub-dam DM1_2, the fourth sub-dam DM2_1, and the third insulating layer INS3 may be formed by simultaneously patterning the same material. The third sub-dam DM1_3, the fifth sub-dam DM2_2, and the pixel defining layer PDL may be formed by simultaneously patterning the same material.

However, exemplary embodiments of the present inventive concepts are not limited thereto. For example, in other exemplary embodiments, the first, second, and third sub-dams DM1_1, DM1_2, and DM1_3 may be formed of a different material from the fourth and fifth sub-dams DM2_1 and DM2_2 and these elements may be formed at various times. In addition, the first, second, and third sub-dams DM1_1, DM1_2, and DM1_3 may be formed of different materials from the second and third insulating layers INS2 and INS3 and the pixel defining layer PDL and these elements may be formed at various times.

The first power line PL1 may extend to pass between the first sub-dam DM1_1 and the second sub-dam DM1_2 and between the fourth sub-dam DM2_1 and the first insulating layer INS1. For example, as shown in the exemplary embodiment of FIG. 6, a lower surface of the first power line PL1 may directly contact lateral edges and an upper surface of the first sub-dam DM1 and a lower surface of the second sub-dam DM1_2. The bridge pattern BP may be disposed under lower surface of the first sub-dam DM1_1 and the first power line PL1 may overlap the bridge pattern BP (e.g., in a thickness direction of the substrate SUB). The bridge pattern BP may be disposed between the first insulating layer INS1 and the first sub-dam DM1_I (e.g., in a thickness direction of the substrate SUB). The first power line PL1 is disposed on an exposed portion of the bridge pattern BP that is exposed to the outside of the first sub-dam DM1_1 to contact portions of the bridge pattern BP, such as an upper surface and lateral edges of the bridge pattern BP. However, exemplary embodiments of the present inventive concepts are not limited thereto. For example, in other exemplary embodiment, the first power line PL1 may extend through the first dam DM1 by passing through various different portions of the first dam DM1 disposed between a lower surface and an upper surface of the first dam DM1 aside from between a first sub-dam DM1_1 and a second sub dam DM1_2 shown in the exemplary embodiment of FIG. 6.

Referring to the exemplary embodiment of FIG. 8, the first power line PL1 and the first sub-dam DM1_1 may extend to intersect each other. For example, the first power line PL1 may extend substantially in the first direction DR1. The first sub-dam DM1_1 may extend substantially in the second direction DR2 to intersect the first power line PLL.

As shown in the exemplary embodiment of FIG. 8, a first width of the bridge pattern BP (e.g., length in the second direction DR2) may be greater than the first width of the first power line PL1 (e.g., length in the second direction DR2). As shown in the exemplary embodiment of FIG. 8, a second width of the bridge pattern BP (e.g., length in the first direction DR1) may be greater than a second width (e.g., length in the first direction DR1) of the first sub-dam DM1_1. An exposed portion of the bridge pattern BP exposed to the outside of the first sub-dam DM1_1 may overlap the first power line PL1 and may directly contact the first power line PL1. For example, the exposed portions of the bridge pattern BP extending further in the first direction DR1 and/or the second direction DR2 than the first sub-dam DM1_1 may directly contact the first power line PL1. However, exemplary embodiments of the present inventive concepts are not limited thereto and the bridge pattern BP may have various different shapes and may extend further than the first sub-dam DM1_1 in any other direction (e.g., directions between the first and second direction DR1, DR2) to provide an exposed portion that is exposed to the outside of the first sub-dam DM1_1 for direct contact with the first power line PL1.

Referring to the exemplary embodiments of FIGS. 6 and 7, when the non-display area NDA is reduced, the widths of the first dam DM1 and the second dam DM2 may also be narrowed. As the width of the first dam DM1 is narrowed, the width of the upper surface of the first sub-dam DM1_1 may also be narrowed.

When the first power line PL1 is formed on a portion of the first dam DM1 protruding upward, such as the first sub-dam DM1_1, as the width of the upper surface of the first sub-dam DM1_1 is narrowed, the first power line PL1 provided on the upper surface of the first sub-dam DM1_1 may be disconnected (e.g., electrically disconnected). Accordingly, a power failure in which power is not normally applied to the pixels PX may occur.

However, in an exemplary embodiment of the present inventive concepts, even in instances in which the first power line PL1 provided on the upper surface of the first sub-dam DM1_1 is electrically disconnected in these portions, the first power line PL1 may be electrically connected through the bridge pattern BP. Therefore, since the first voltage is normally applied to the pixels PX through the first power line PL1, power failure may be reduced.

Figure 9:
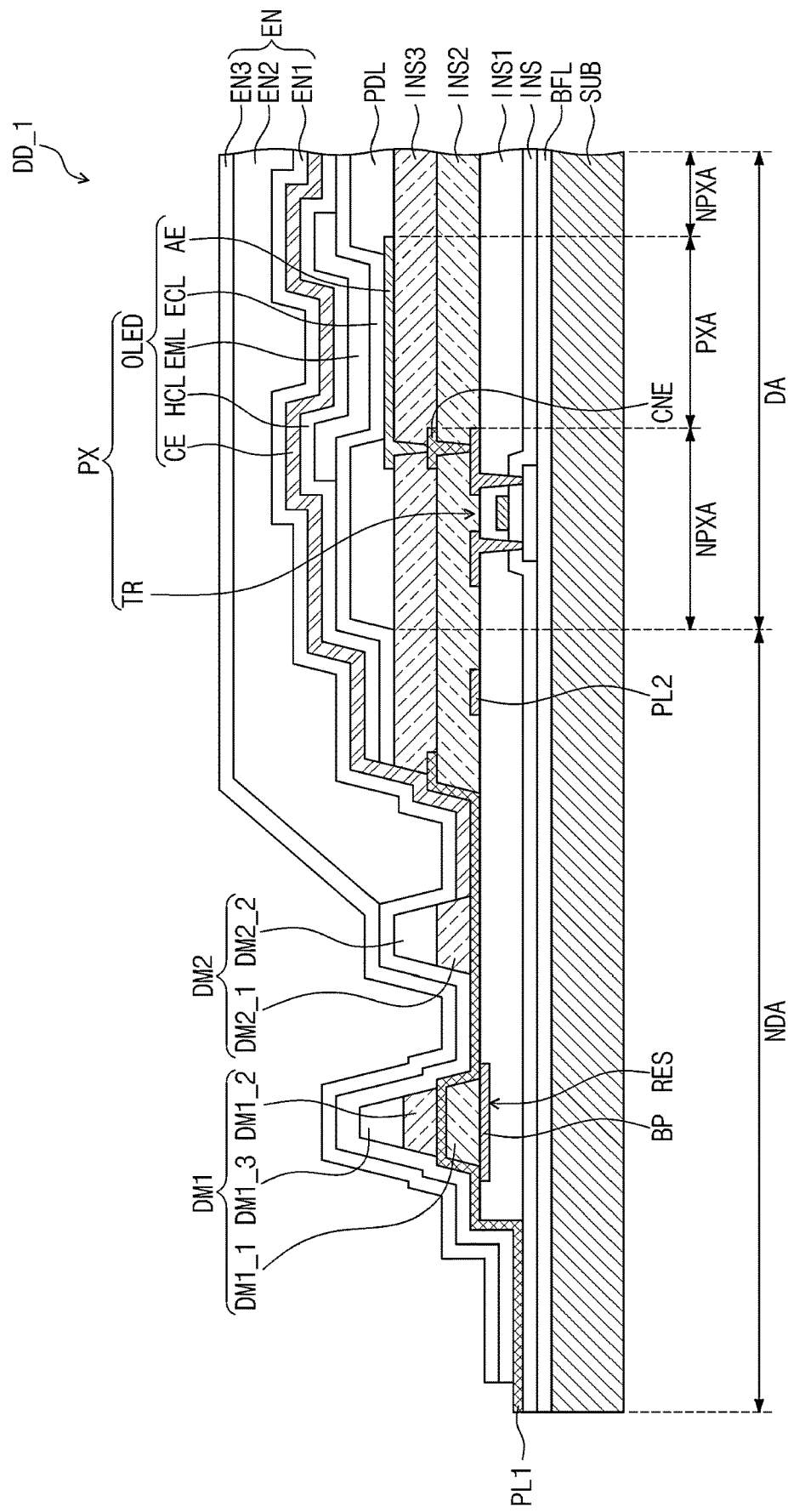
FIGS. 9 and 10 are cross-sectional views of display devices according to other exemplary embodiments of the present inventive concepts.
Figure 10:
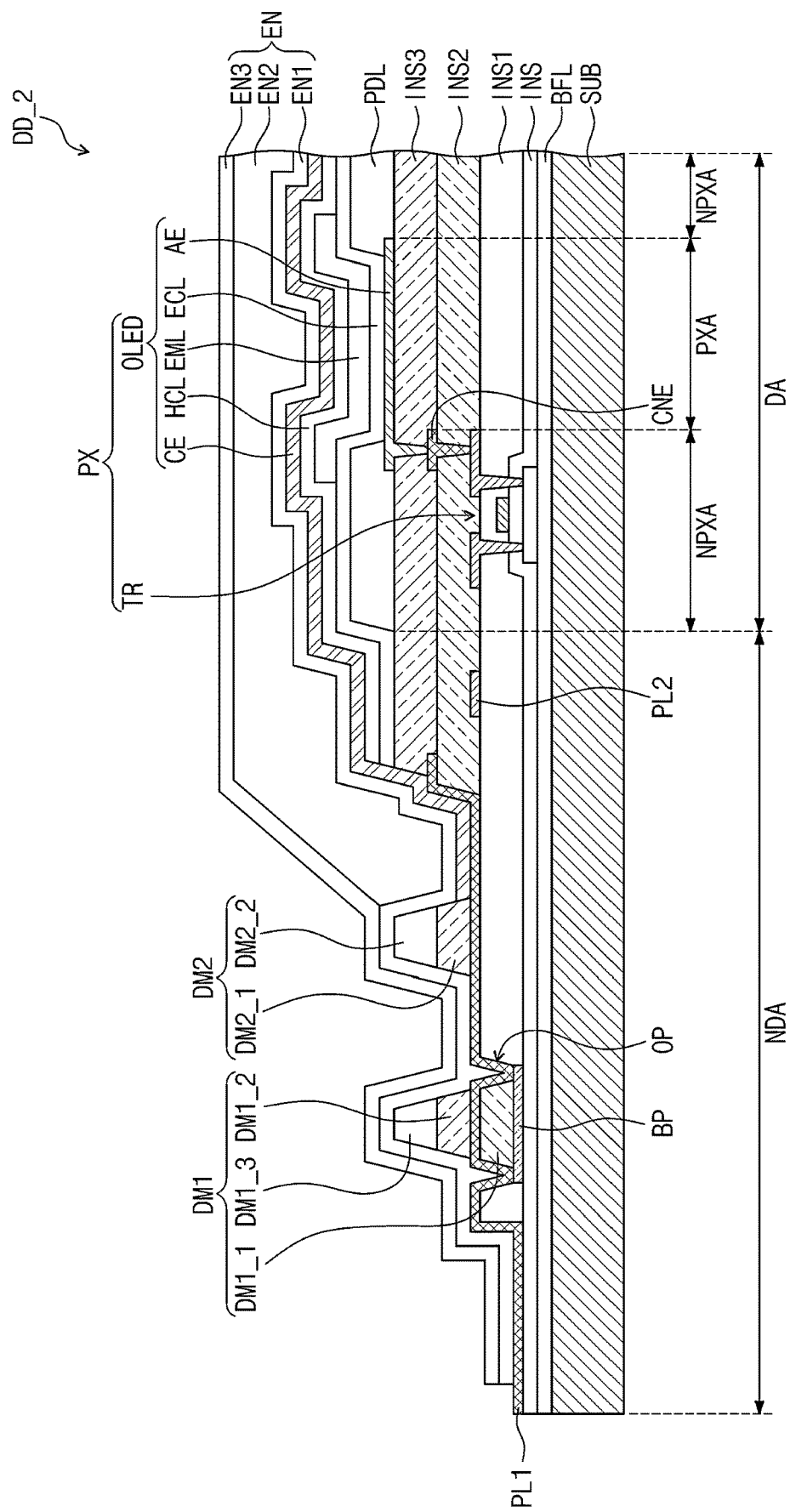

FIGS. 9 and 10 are cross-sectional views of display devices according to other exemplary embodiments of the present inventive concepts.

FIGS. 9 and 10 are illustratively shown in a cross-section corresponding to FIG. 6. Hereinafter, the configurations of the display devices DD_1 and DD_2 shown in FIGS. 9 and 10 will be described based mainly on the elements that differ from the exemplary embodiment shown in FIG. 6 and substantially identical elements will not be described for convenience of explanation. In addition, like reference numerals refer to like elements.

Referring to the exemplary embodiment of FIG. 9, a recess RES may be defined in the first insulating layer INS1 of the display device DD_1. The recess RES may be defined on the upper surface of the first insulating layer INS1 overlapping the first dam DM1 (e.g., in a thickness direction of the substrate SUB). The recess RES may have a width (e.g., length in a direction parallel to an upper surface of the substrate SUB) that is larger than the width of the first dam DM1.

A bridge pattern BP may be disposed in the recess RES. Since the bridge pattern BP is disposed in the recess RES, the bridge pattern BP may be more stably disposed on the first insulating layer INS1.

The first dam DM1 may be disposed on the bridge pattern BP. As described above, the first power line PL1 is disposed on an exposed portion of the bridge pattern BP that is exposed to the outside of the first dam DM1 to contact the bridge pattern BP.

Referring to the exemplary embodiment of FIG. 10, an opening part OP may be defined in the first insulating layer INS1 of the display device DD_2. The opening part OP may overlap the first dam DM1. The opening part OP may have a width (e.g., length in a direction parallel to an upper surface of the substrate SUB) that is greater than the width of the first dam DM1.

A bridge pattern BP may be disposed on the opening part OP. For example, as shown in the exemplary embodiment of FIG. 10, a lower surface of the bridge pattern BP in the opening part OP may directly contact an upper surface of the insulating layer INS. Since the bridge pattern BP is disposed in the opening part OP, the bridge pattern BP may be more stably disposed.

The first dam DM1 may be disposed on the bridge pattern BP and may also be disposed in the opening part OP. In the opening part OP, the first power line PL1 is disposed on a portion of the bridge pattern BP exposed to the outside of the first dam DM1 to contact the bridge pattern BP. For example, as shown in the exemplary embodiment of FIG. 10, a lower surface of the first power line PL1 may directly contact lateral ends of the upper surface of the bridge pattern BP.

FIGS. 11 to 14 are diagrams illustrating bridge patterns according to various exemplary embodiments of the present inventive concepts.

Illustratively, FIGS. 11 to 14 are shown in a plan view corresponding to FIG. 8. Hereinafter, the configurations of the bridge patterns BP1_1 to BP1_4 shown in FIGS. 11 to 14 will be described mainly based on the elements that differ from the exemplary embodiment shown in FIG. 8 and substantially identical elements will not be described for convenience of explanation. In addition, like reference numerals refer to like elements.

Figure 11:
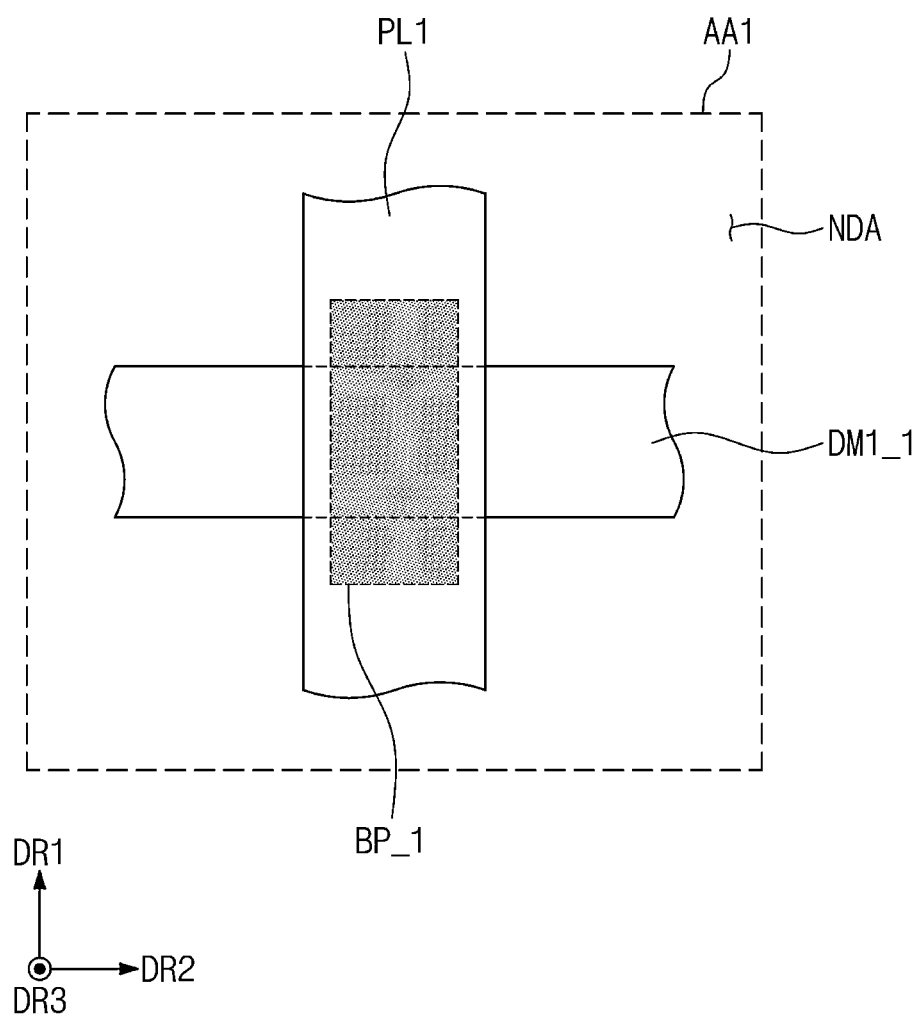
FIGS. 11 to 14 are plan views showing bridge patterns according to exemplary embodiments of the present inventive concepts.

Referring to the exemplary embodiment of FIG. 11, the first power line PL1 may extend in the first direction DR1 and the first sub-dam DM1_1 may extend in the second direction DR2. As shown in the exemplary embodiment of FIG. 11, a first width (e.g., length in the second direction DR2) of the bridge pattern BP_1 may be less than the first width (e.g., length in the second direction DR2) of the first power line PL1. A second width of the bridge pattern BP_1 (e.g., length in the first direction DR1) may be greater than a second width (e.g., length in the first direction DR1) of the first sub-dam DM1_1. An exposed portion of the bridge pattern BP_1 exposed to the outside of the first sub-dam DM1_1 may contact the first power line PLL. For example, the exposed portions of the bridge pattern BP_1 extending further in the first direction DR1 than the first sub-dam DM1_1 may directly contact the first power line PL1.

Figure 12:
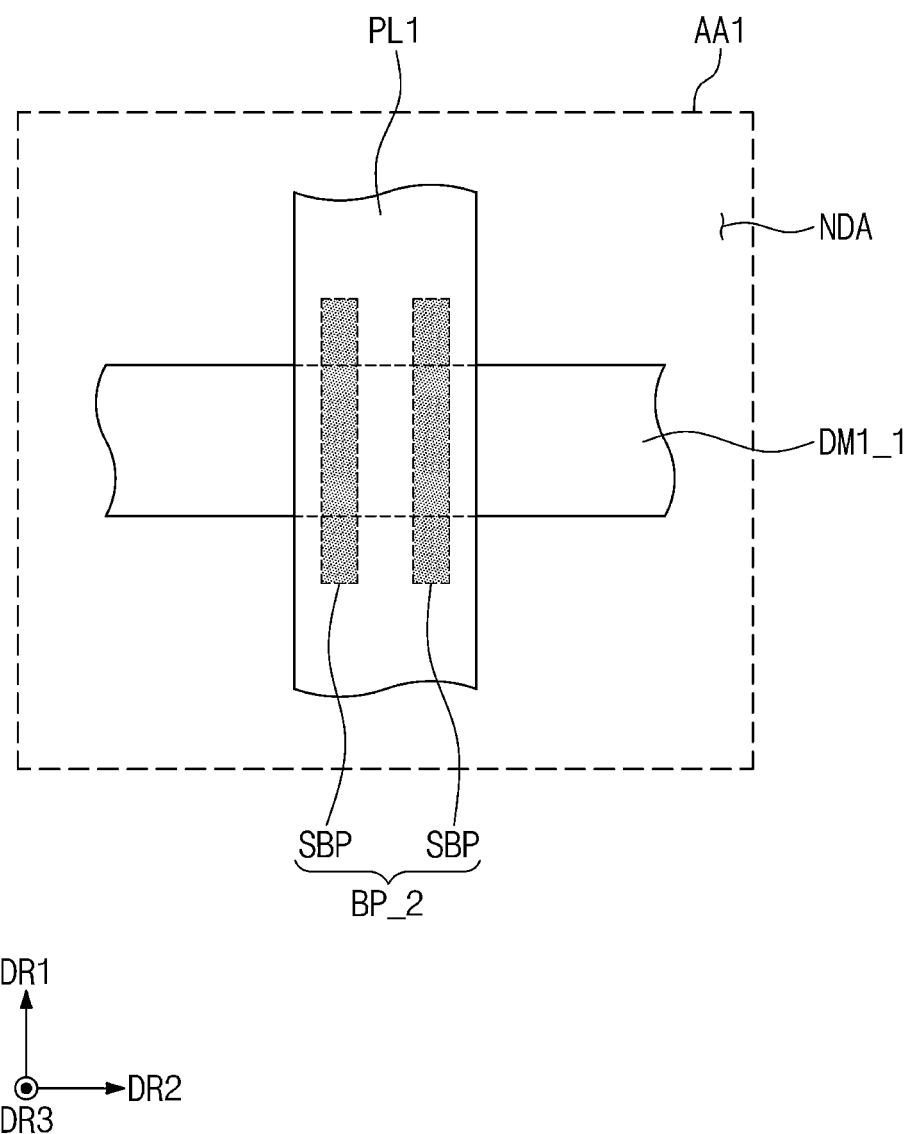

Referring to the exemplary embodiment of FIG. 12, the bridge pattern BP_2 may extend in the first direction DR1 and include a plurality of sub-bridge patterns SBP arranged in the second direction DR2 and extending in the first direction DR1. In the exemplary embodiment shown in FIG. 12, two sub-bridge patterns SBP are illustrated. However, exemplary embodiments of the present inventive concepts are not limited thereto and the number of sub-bridge patterns SBP may be three or more in other exemplary embodiments.

A first width (e.g., length in the second direction DR2) of each of the sub-bridge patterns SBP may be smaller than a first width (e.g., length in the second direction DR2) of the first power line PI. A second width of each sub-bridge pattern SBP (e.g., length in the first direction DR1) may be greater than a second width (e.g., length in the first direction DR1) of the first sub-dam DM1_1. Exposed portions of the sub-bridge patterns SBP that are exposed to the outside of the first sub-dam DM1_1 may contact the first power line PL1. For example, the exposed portions of the each sub-bridge pattern SBP extending further in the first direction DR1 than the first sub-dam DM1_1 may directly contact the first power line PL1.

Figure 13:
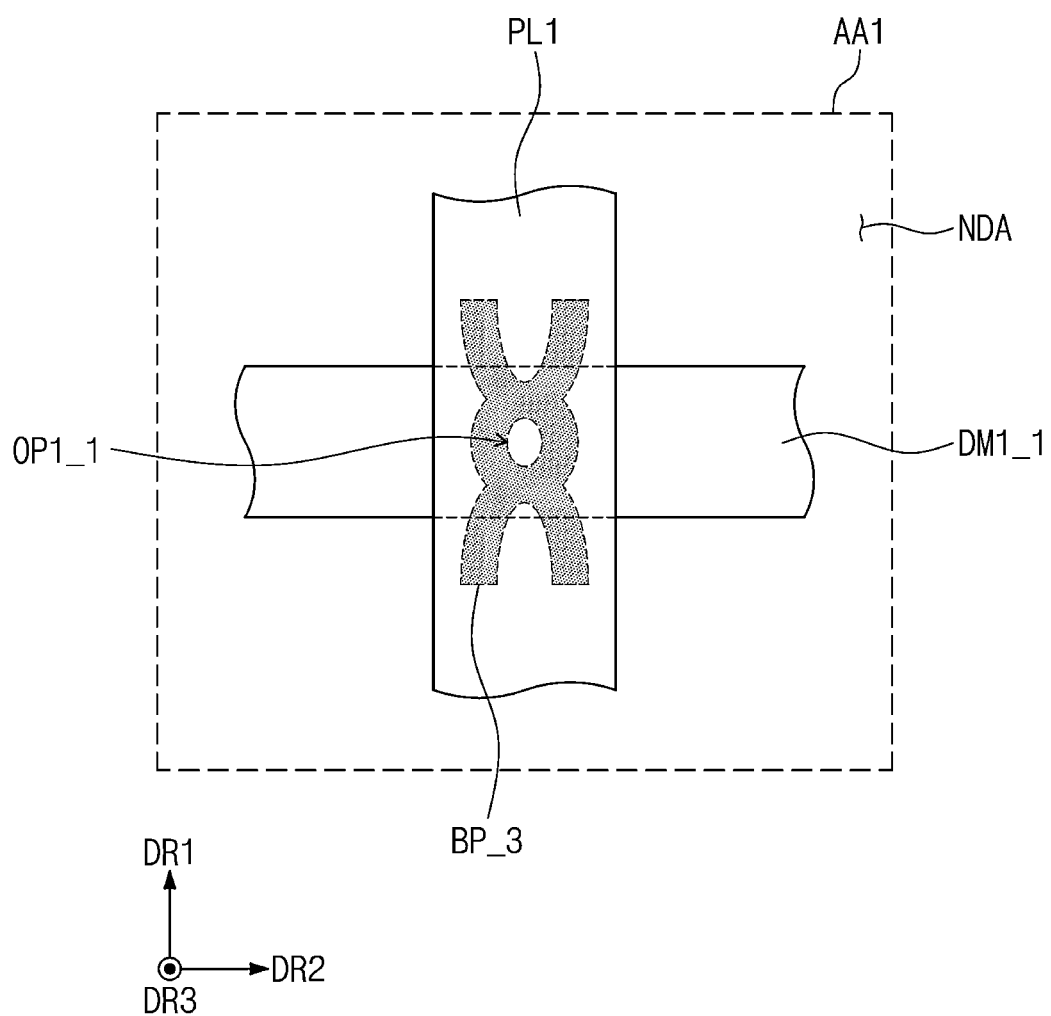

Referring to the exemplary embodiment of FIG. 13, the bridge pattern BP_3 has a smaller first width (e.g., length in the second direction DR2) than the first power line PL1 and may have a greater second width (e.g., length in the first direction DR1) than the first sub-dam DM1_1. The bridge pattern BP_3 may have a shape that extends to have a continuous curved. At least one first opening part OP1_1 may be defined in the bridge pattern BP_3. For example, as shown in the exemplary embodiment of FIG. 13, one first opening part OP1_1 is defined in a central portion of the bridge pattern BP_3. In an exemplary embodiment, the first opening part OP1_1 may have an elliptical shape. However, exemplary embodiments of the present inventive concepts are not limited thereto and the shape of the first opening part OP1_1 and the positioning thereof may vary in other exemplary embodiments.

Figure 14:
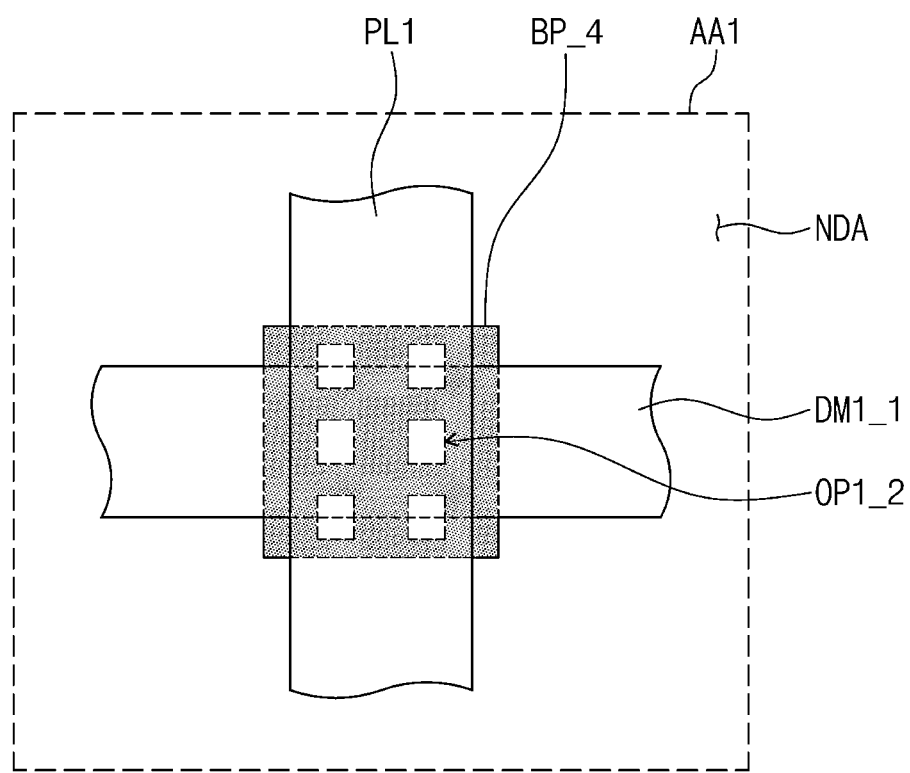

Referring to the exemplary embodiment of FIG. 14, the bridge pattern BP_4 has a greater first width (e.g., length in the second direction DR2) than the first power line PL1 and may have a greater second width (e.g., length in the first direction DR1) than the first sub-dam DM1_1. A plurality of first opening parts OP1_2 may be defined in the bridge pattern BP_4. For example, the exemplary embodiment shown in FIG. 14 includes six first opening parts OP1_2. The first opening parts OP1_2 may be arranged in a matrix form and have a rectangular shape. Portions of the first opening parts OP1_2 may extend outwardly from the first sub-dam DM1_1 (e.g., in the first direction DR1). However, exemplary embodiments of the present inventive concepts are not limited thereto.

Although not shown in the drawing, additionally, the first opening parts OP1_2 may be defined in the bridge pattern BP_1 shown in FIG. 11. Also, the bridge patterns BP_1 to BP_4 shown in FIGS. 11 to 14 may be applied to the display devices DD_1 and DD_2 shown in FIGS. 9 and 10.

According to an exemplary embodiment of the present inventive concepts, a bridge pattern is disposed under the first sub-dam, and a first power line extending over the first sub-dam may be connected to the bridge pattern. According to this structure, even if the first power line on the first sub-dam is damaged, since the first voltage is applied to the pixels through the bridge pattern, power failure may be reduced.

Although exemplary embodiments of the present inventive concepts have been described, it is understood that the present inventive concepts should not be limited to these exemplary embodiments but various changes and modifications can be made by one ordinary skilled in the art within the spirit and scope of the present inventive concepts as hereinafter claimed.

What is claimed is:

1. A display device comprising:
a substrate including a display area and a non-display area around the display area;
a pixel disposed on the display area;
a first dam disposed on the non-display area, the first dam including a first sub-dam and a second sub-dam disposed on the first sub-dam;
a first power line disposed on the non-display area and passing entirely between the first sub-dam and the second sub-dam and contacting both lateral sides of the first sub-dam, the first power line is connected to the pixel; and
a bridge pattern disposed under the first sub-dam, the bridge pattern is connected to the first power line.

2. The display device of claim 1, wherein:
the first power line extends in a first direction; and
a first width of the bridge pattern in a second direction intersecting the first direction is greater than a first width of the first power line in the second direction.

3. The display device of claim 2, wherein:
the first sub-dam extends in the second direction,
wherein a second width of the bridge pattern in the first direction is greater than a second width of the first sub-dam in the first direction.

4. The display device of claim 3, wherein the first power line directly contacts an exposed portion of the bridge pattern that extends to the outside of the first sub-dam.

5. The display device of claim 1, wherein the bridge pattern includes a conductive material.

6. The display device of claim 1, wherein the pixel comprises:
a light emitting element disposed on the display area and including a first electrode, a second electrode, and a light emitting layer disposed between the first electrode and the second electrode; and
a transistor disposed on the display area and connected to the first electrode,
wherein the second electrode extends to the non-display area and is connected to the first power line.

7. The display device of claim 6, further comprising:
a second power line connected to the transistor,
wherein the display device is configured to apply a first voltage to the first power line,
wherein the display device is configured to apply a second voltage having a higher power level than the first voltage to the second power line.

8. The display device of claim 1, further comprising:
a second dam disposed on the non-display area between the display area and the first dam,
wherein the first power line is disposed under a lower surface of the second dam.

9. The display device of claim 8, wherein:
the first dam further includes a third sub-dam disposed on the second sub-dam; and
the second dam includes a fourth sub-dam and a fifth sub-dam disposed on the fourth sub-dam,
wherein the second sub-dam comprises the same material as the fourth sub-dam,
wherein the third sub-dam comprises the same material as the fifth sub-dam.

10. The display device of claim 9, further comprising:
a first insulating layer disposed on the substrate,
wherein the first dam and the second dam are disposed on the first insulating layer,
wherein the bridge pattern is disposed between the first insulating layer and the first sub-dam in a thickness direction of the substrate.

11. The display device of claim 10, wherein the first power line passes between the fourth sub-dam and the first insulating layer.

12. The display device of claim 10, wherein:
an upper surface of the first insulating layer includes a recess; and
the bridge pattern is disposed on the recess.

13. The display device of claim 10, wherein:
an opening part is defined in the first insulating layer; and
the bridge pattern is disposed in the opening part.

14. The display device of claim 1, wherein:
the first power line extends in a first direction;
the first sub-dam extends in a second direction intersecting the first direction;
wherein a first width of the bridge pattern in the second direction is smaller than a first width of the first power line in the second direction;
wherein a second width of the bridge pattern in the first direction is larger than a second width of the first sub-dam in the first direction.

15. The display device of claim 14, wherein the bridge pattern comprises a plurality of sub-bridge patterns extending in the first direction and arranged in the second direction.

16. The display device of claim 1, wherein at least one first opening part is defined in the bridge pattern.

17. A display device comprising:
a substrate including a display area and a non-display area around the display area;
a pixel disposed on the display area;
a first dam disposed on the non-display area, the first dam including an outer lateral side and an inner lateral side, the outer lateral side is positioned farther from the display area than the inner lateral side;
a second dam disposed between the first dam and the display area;
a first power line disposed on the non-display area and passing under a lower surface of the second dam and between an upper surface and a lower surface of the first dam, the first power line is connected to the pixel; and
a bridge pattern disposed under the lower surface of the first dam and including an exposed portion that extends farther from the display area than the outer lateral side of the first dam, the bridge pattern is connected to the first power line at the exposed portion.

18. The display device of claim 17, further comprising:
a second power line connected to the pixel,
wherein the display device is configured to apply a first voltage to the first power line,
wherein the display device is configured to apply a second voltage having a higher power level than the first voltage to the second power line.

19. The display device of claim 17, wherein the first dam comprises:
a first sub-dam; and
a second sub-dam disposed on the first sub-dam,
wherein the first power line passes between the first sub-dam and the second sub-dam.

20. The display device of claim 19, further comprising a first insulating layer disposed on the substrate,
wherein the first dam and the second dam are disposed on the first insulating layer, wherein the bridge pattern is disposed between the first insulating layer and the first sub-dam in a thickness direction of the substrate, wherein the first power line passes between the first insulating layer and the second dam.

* * * * *